United States Patent
Shoji et al.

(10) Patent No.: US 6,780,745 B2
(45) Date of Patent: *Aug. 24, 2004

(54) SEMICONDUCTOR INTEGRATED CIRCUIT AND METHOD OF MANUFACTURING THE SAME

(75) Inventors: Kimikatsu Shoji, Tokyo (JP); Hirofumi Tadokoro, Tokyo (JP); Osamu Yanaga, Tokyo (JP)

(73) Assignee: Oki Electric Industry Co. Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/377,740

(22) Filed: Aug. 20, 1999

(65) Prior Publication Data

US 2001/0045572 A1 Nov. 29, 2001

(30) Foreign Application Priority Data

Aug. 20, 1998 (JP) .......................................... 10/234333

(51) Int. Cl.[7] ................................................ H01L 21/44
(52) U.S. Cl. ........................ 438/598; 438/599; 438/618
(58) Field of Search ................................ 438/598, 599, 438/618, 600, 601, 622, 625; 326/37, 39, 41, 47; 257/200, 211

(56) References Cited

U.S. PATENT DOCUMENTS

| | | | | |
|---|---|---|---|---|
| 4,701,778 A | * | 10/1987 | Aneha et al. | 257/207 |
| 4,766,475 A | * | 8/1988 | Kawashima | 257/203 |
| 5,539,224 A | * | 7/1996 | Ema | 257/210 |
| 5,552,722 A | * | 9/1996 | Kean | 326/41 |
| 5,665,989 A | * | 9/1997 | Dangelo | 257/210 |
| 6,020,755 A | * | 2/2000 | Andrews et al. | 326/39 |
| 6,078,191 A | * | 6/2000 | Chan et al. | 326/40 |

FOREIGN PATENT DOCUMENTS

WO    WO 98/13938    *   4/1998

* cited by examiner

*Primary Examiner*—Sara Crane
(74) *Attorney, Agent, or Firm*—Venable LLP; Michael A. Sartori; Chad C. Anderson

(57) ABSTRACT

An IC chip comprises a chip peripheral portion and a core macro portion. The chip peripheral portion is made up of a plurality of I/O buffers each of which serves as an interface between the IC chip and the outside thereof, and a plurality of pads to which bonding wires are electrically connected. A CPU core block, peripheral blocks, random logic blocks, and a gate array block are placed in the core macro portion. The respective blocks are electrically connected to one another by metal interconnections. The gate array block designed by a gate array system is layout-designed in accordance with a standard cell system or full custom system together with other blocks.

8 Claims, 2 Drawing Sheets

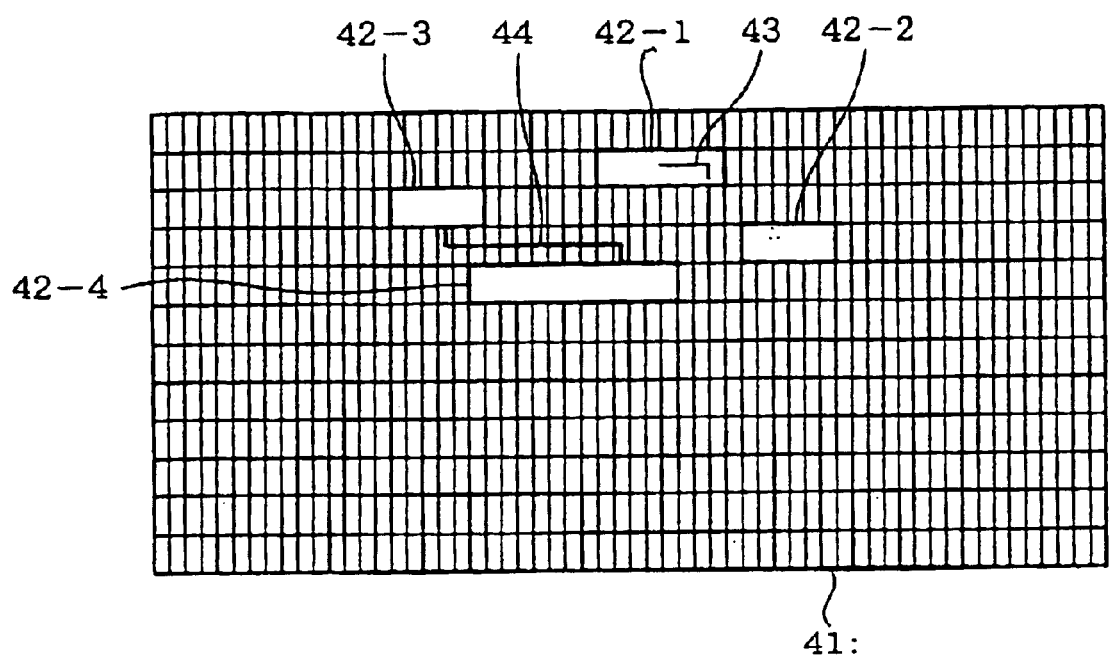

SEMICONDUCTOR INTEGRATED CIRCUIT AND METHOD OF MANUFACTURING THE SAME

BACKGROUND OF THE INVENTION

1. Field of the Invention

This invention relates to a semiconductor integrated circuit (hereinafter called "IC") and a method of manufacturing it, and particularly to a method of laying out respective circuit blocks which constitute the IC.

2. Description of the Related Art

A custom IC such as an ASIC (Application Specific Integrated Circuit) is normally designed by a gate array system, an embedded array system, a standard cell system or full custom system.

In an IC designed by the gate array system, layers other than a metal wiring layer are formed as master slices in advance and a plurality of basic cells are provided, followed by formation of wiring layers, whereby the basic cells are electrically connected to one another and circuit functions constituting a NAND circuit and an OR circuit can be implemented.

According to the standard cell system or full custom system, since dedicated macro cells such as a CPU, a RAM or the like comprised of pre-designed circuit blocks are used, the area of the IC chip can be less reduced. The use of a layout editor or the like in particular allows the attainment of the minimum area of the IC chip.

The embedded array system in contrast to the above-described gate array system, standard cell system and full custom system has the following characteristics. Namely, according to the embedded array system, dedicated macro cells such as a CPU, a RAM, etc. are embedded in a base array at a design state of an IC layout. In the embedded array system, a layer is provided in which functional elements or devices such as MOS transistors, etc. are formed by using a previously-designed and manufactured mask, and each of the wiring layers for interconnecting the plurality of functional devices with one another is formed over the layer in which the functional elements or devices are formed. Incidentally, each of the wiring layers is normally hereinafter called a "customized layer" because it is designed for each user. On the other hand, the layer in which the functional devices are formed, is hereinafter called a "non-customized layer" because it is used on a general-purpose basis.

Owing to the adoption of the embedded array system in this way, the design and fabrication of the mask for forming the non-customized layer are allowed even at a stage in which logic circuits other than the dedicated macro cells have not been determined. Thus, an IC is formed in a shorter turn around time ("TAT") similar to that employed in the gate array system in which the logic circuits are implemented by the customized layer alone.

Even when it is necessary to change a logic circuit, only a change in customized layer allows for such a circuit change without a change in mask for forming the non-customized layer.

The layout of dedicated macro cells according to the embedded array system are designed in accordance with, for example, the standard cell system or full custom system. According to the full custom system, each dedicated macro cell is implemented in a narrow area as compared with the gate array system. Consequently, the chip area of the IC laid out by the embedded array system is smaller than that for an IC laid out by the pure gate array system.

In the gate array system on the other hand, the IC designed by the gate array system normally makes use of a large number of general-purpose functional devices so as to correspond to a plurality of specifications. Therefore, the chip area of the IC will spontaneously increase.

While the chip area of the IC designed by the standard cell system or full custom system is decreased as described above, the period from the completion of its design to the start of fabrication of all the layers of the IC is longer.

As those other than the dedicated macro cells, so-called design resources such as the macro cells and base array designed by the gate array system, etc. are used in the embedded array system. Since the macro cells designed by the gate array system have high general versatility corresponding to a plurality of specifications, they increase in scale as compared with the macro cells generally designed by the standard cell system or the full custom system. Accordingly, the chip area of the IC designed by the embedded array system increases as compared with that designed by the standard cell system or full custom system and hence this exerts a significant influence on the cost of the chip.

With the foregoing in view, it is therefore an object of the present invention to provide a method of manufacturing a semiconductor integrated circuit, which is capable of reducing a chip area thereof and being designed and manufactured in a short period of time.

SUMMARY OF THE INVENTION

In order to achieve the above object, the present invention provides a method of manufacturing a semiconductor integrated circuit comprised of a plurality of functional blocks and a gate array block, each of these functional blocks respectively provided with predetermined functions by arbitrarily-placed semiconductor devices, the method comprising the following steps:

a first step for placing a gate array block comprised of a plurality of basic cells arranged in line and a plurality of functional blocks within a predetermined area of a semiconductor chip;

a second step for designing necessary circuits in the gate array block; and a third step for electrically connecting between the gate array lying within the basic cell block by using interconnections.

According to the manufacturing method, circuits formed by the plurality of functional blocks are determined in the first step. Masks corresponding to the determined circuits can be designed and manufactured. Another step for determining a circuit corresponding to the basic cell block by using a gate array system can be executed in parallel with the design and fabrication of the masks. Thus, the time required to complete the semiconductor integrated circuit inclusive of the design and fabrication thereof can be reduced as compared with the case in which the design and manufacture of the masks are started after all the circuits have been determined.

The basic cell block and the plurality of functional blocks are may be laid out by a standard cell system. Alternatively, they may be laid out by a full custom system. According to the method referred to above, the semiconductor integrated circuit can be implemented by a chip having a small area.

If a plurality of basic gates are electrically connected to one another by metal wiring layers to construct the circuit for the basic cell block, then the circuit corresponding to the basic cell block in the second step is determined by principally designing the metal wiring layers. Namely, masks corresponding to metal wiring layers for electrically connecting between the functional blocks are designed and manufactured, and metal wiring layers for electrically connecting the basic cells lying within the basic cell block are formed using the masks in the second step, whereby all the circuits employed in the semiconductor integrated circuit are completed. According to the present method, the time required between the completion of the design of the semiconductor integrated circuit and the completion of the fabrication thereof substantially coincides with the time required to form the metal wiring layers. Thus, the period during which the semiconductor integrated circuit is completed, can be greatly reduced as compared with the prior art.

Further, one of the plurality of functional blocks can be formed as a CPU core block or memory cell block.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a block diagram illustrating a configuration of a gate array block built in the IC chip shown in FIG. 1.

DETAILED DESCRIPTION OF THE PREFERRED EMBODIMENTS

Figure 1:
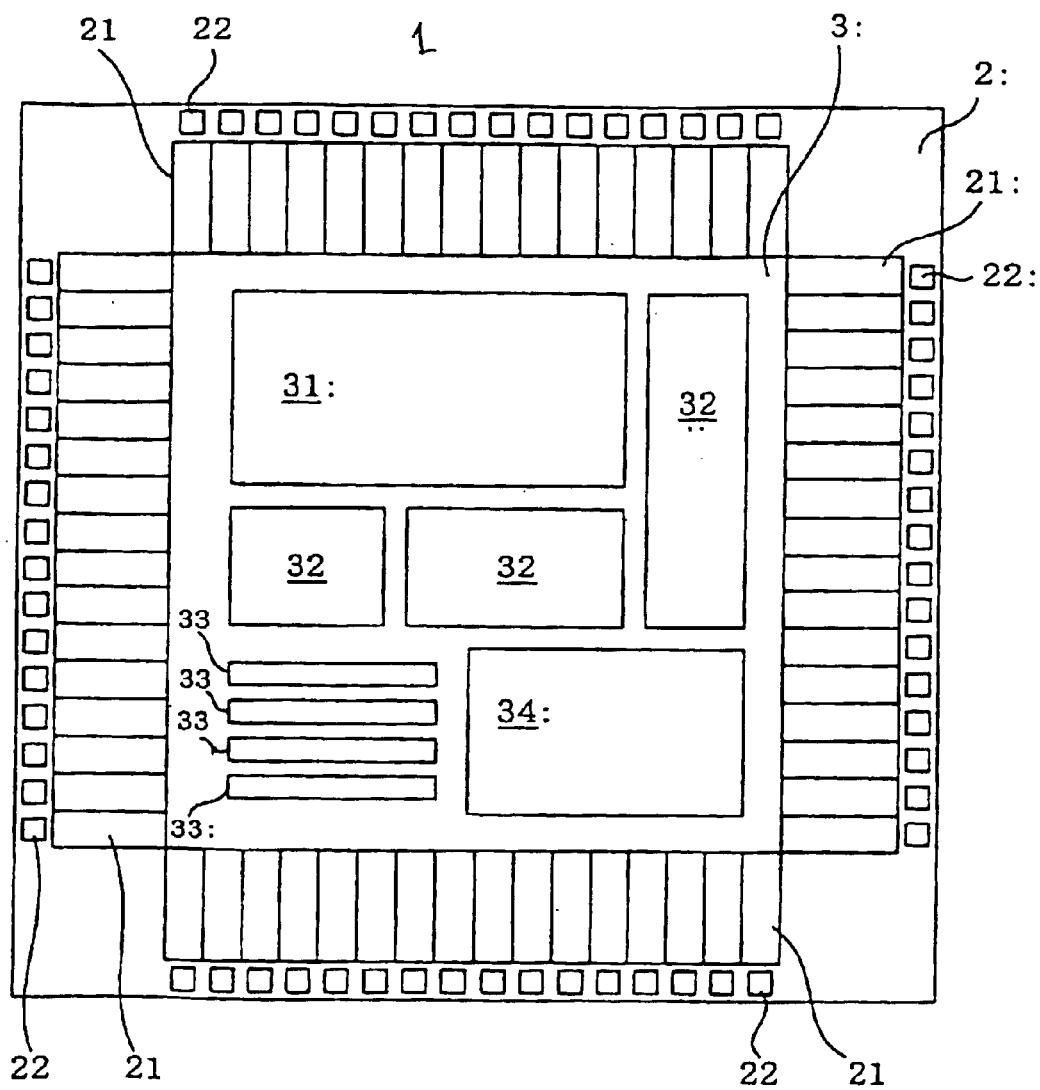
FIG. 1 is a block diagram showing a configuration of an IC chip according to an embodiment of the present invention.

Preferred embodiments of the present invention will hereinafter be described in detail with reference to the accompanying drawings. In the following description, components or elements having functions and structures substantially identical to one another are identified by the same reference numerals and the description of certain common elements will therefore be omitted.

It is desirable to adopt the standard cell system or full custom system as described above for the purpose of reducing the area of an IC chip. As has been practiced by the embedded array system in general, a single common mask used for the formation of each non-customized layer is designed and manufactured prior to (or in parallel with) the formation of a customized layer so that the TAT can be shortened.

In order to previously design and manufacture the non-customized layer masks for the non-customized layers, the following two conditions must be met. The first condition is as follows: It is necessary to fix patterns for functional elements or devices such as transistors for constituting each non-customized layer and avoid changes in patterns after the design and fabrication of the mask are started. Further, the second condition is as follows: Interconnections in each wiring layer used as a customized layer are suitably formed in association with the non-customized layer so that desired functions are obtained. Namely, if basic gates (also called "basic cells") based on the gate array system are partially embedded in the IC designed by the standard cell system or full custom system, and the plurality of embedded basic gates are electrically connected to one another and utilized in combination so as to implement the desired functions, then the non-customized layer masks used for the non-customized layers can be designed and fabricated prior to the formation of the customized layer even in the case of the IC designed by the standard cell system or full custom system.

A process for designing such an IC as to allow the non-customized layer masks for the non-customized layers to be designed and fabricated prior to the formation of the customized layer, using the standard cell system or full custom system will next be explained.

First of all, a whole-circuit layout area of a semiconductor substrate (or chip) for forming the IC thereon is divided into an area (corresponding to a function cell block layout area) in which a circuit is already determined and no change occurs in the circuit, and an area (corresponding to an area in which a plurality of basic cells are arranged in line) having the potential of a change in circuit.

Next, design resources based on the gate array system are blocked to effect layout design on the area having the potential of change in circuit. The layout of the entire IC is designed while the blocked design resources based on the gate array system are being captured by a CAD (Computer Aided Design) of the standard cell system or full custom system. Upon completion of the layout design of the entire IC, the design and fabrication of the non-customized layer masks related to the non-customized layers is started.

Thereafter, when the contents of the circuit is determined in the area having the potential of the change in circuit, each gate array block corresponding to a basic cell block is again laid out using the CAD of the gate array system. The design and fabrication of a circuit mask corresponding to each customized layer are started based on the re-laid out gate array block. Incidentally, the gate array block whose circuit has been determined, is laid-out in a design based on the non-customized layers formed by the previously-designed and fabricated non-customized layer masks. Namely, the gate array block preceding the determination of the circuit and the gate array block subsequent to the determination of the circuit are respectively made up of the same basic gate comprised of basic gates identical in number in both the vertical and horizontal directions.

An IC chip 1 according to the embodiment of the present invention will next be explained with reference to FIGS. 1 and 2. The IC chip 1 comprises a chip peripheral portion 2 and a core macro portion 3.

The chip peripheral portion 2 is made up of a plurality of I/O buffers 21 which serve as interfaces between the IC chip 1 and the outside thereof, and a plurality of pads 22 to which bonding wires are electrically connected.

For example, a CPU core block 31, peripheral blocks 32, random logic blocks 33, and a gate array block 34 are placed in the core macro portion 3 surrounded by the chip peripheral portion 2. The respective blocks are electrically connected to one another through the use of metal wires or interconnections. Circuit-designed design resources are used for the CPU core block 31, peripheral blocks 32 and random logic blocks 33.

Transistors, which constitute the CPU core block 31, the peripheral blocks 32 and the random logic blocks 33, normally have arbitrary forms respectively and are designed according to the standard cell system or full custom system. On the other hand, the gate array block 34 is comprised of a plurality of basic gates 41 (e.g., MOS transistors) arranged in an array form as shown in FIG. 2. Logic elements or devices 42-1, 42-2, 42-3, 42-4, . . . (such as a NAND circuit, a NOR circuit, an inverter, etc.) are formed by utilizing the basic gates 41 in combination.

The functions of the logic devices 42-1, 42-2, 42-3, 42-4, . . . are implemented by connecting respective terminals of the transistors constituting the respective basic gates 41 to one another through interconnections 43. The function of the gate array block 34 is implemented by connecting the respective logic devices 42-1, 42-2, 42-3, 42-4, . . . to one another through the use of metal interconnections 44 based on circuit connection information.

The gate array block 34 constructed as described above is placed over the IC chip 1 together with the CPU core block 31, the peripheral blocks 32 and the random logic blocks 33 constituting the chip peripheral portion 2 and the core macro portion 3. Thus, the design of the layout of the IC chip 1 is completed.

Since diffused layers, polysilicon layers, metal wiring layers, etc. are conventionally formed after the design and fabrication of the masks when the IC is designed by the standard cell system or full custom system, it normally took several months to complete the IC. On the other hand, according to the IC chip 1 in an embodiment of the present invention, it is possible to previously design and manufacture the non-customized layer masks corresponding to the non-customized layers during a logic-simulation stage, for example. Further, the design work such as the logic simulation or the like is continuously performed in parallel with the design and fabrication of the non-customized layer masks. Thereafter, when the corresponding circuit for the gate array block 34 has been determined, the layout of the gate array block 34 is designed again, and the circuit mask corresponding to a customized layer is designed fabricated.

When the fabrication of the non-customized layers is completed before the start of the fabrication of the customized layer, for example, a TAT required from the start of the fabrication of the customized layer to the completion of formation of all the layers of the IC chip 1 takes the same several weeks as the manufacturing period of the customized layer. Namely, the period from the completion of the design of the IC to the completion of the fabrication of the IC chip can be greatly reduced by several months to several weeks as compared with the prior art in which the IC has been designed using the standard cell system or full custom system.

According to the IC chip 1 related to the embodiment of the present invention, when a circuit change occurs in the gate array block 34, the designer of the IC chip can cope with such a circuit change by redesigning only the gate array block 34 while the contents of the circuit of the non-customized layers is maintained. That is, only the circuit mask related to the gate array block 34 is changed in design. Thus, the circuit change of the gate array block 34 can be completed in a short period of time.

The function of the circuit for the gate array block 34 can be implemented by connecting the logic devices 42-1, 42-2, 42-3, 42-4, . . . comprised of the basic gates 41 to one another using the metal interconnections 44 formed in the customized layer. Namely, an IC having diversified functional variations is manufactured by utilizing a plurality of gate array blocks different in function in combination with one type of non-customized layer.

While the present invention has been described by the preferred embodiment of the present invention while referring to the accompanying drawings, the present invention is not necessarily limited to the disclosed embodiment.

While the IC chip 1 according to the present invention has been described in conformity with the CPU, for example, the present invention is not limited to this embodiment. The present invention is applicable to other semiconductor integrated circuits such as a RAM, etc.

According to the present invention, as has been described above, the time required to complete a semiconductor integrated circuit inclusive of the design and fabrication thereof can be greatly reduced. Further, the semiconductor integrated circuit can be implemented by a chip having a small area.

What is claimed is:

1. A method of manufacturing a semiconductor integrated circuit comprising the steps of:

employing a plurality of non-customized layer masks to form a plurality of functional blocks and a gate array block within predetermined first areas on a surface of a semiconductor chip, said functional blocks being provided respectively with predetermined functions by semiconductor devices and said gate array block including a plurality of unconnected basic cells;

placing a plurality of I/O buffers in a second area surrounding said first area;

designing circuits for inclusion in said gate array block; and employing at least one circuit mask to establish electrical connections between the basic cells in accordance with the circuits designed in the previous step, whereby the time required to manufacture the semiconductor integrated circuit and the size of said first areas is minimized.

2. The method of manufacturing a semiconductor integrated circuit according to claim 1, wherein the electrical connections established between the basic cells provide at least one logic element.

3. A method of manufacturing a semiconductor integrated circuit according to claim 1, wherein said gate array block is laid out by a standard cell system.

4. A method of manufacturing a semiconductor integrated circuit according to claim 1, wherein said gate array block is laid out by one of a standard cell system and a full custom system.

5. A method of manufacturing a semiconductor integrated circuit according to claim 1, comprising the further steps of establishing electrical connections between the functional blocks and establishing electrical connections between the functional block and the gate array block.

6. A method of manufacturing a semiconductor integrated circuit comprising the steps of:

a first step of employing a plurality of non-customized layer masks to form a plurality of functional blocks and a gate array block within predetermined first areas on a surface of a semiconductor chip, said functional blocks having predetermined functions and said gate array block including a plurality of unconnected basic cells;

a second step of designing a circuit for inclusion in the gate array block; and a third step of employing at least one circuit mask to establish electrical connections between the basic cells in accordance with the circuit designed in the second step.

7. The method of claim 6, wherein at least part of said second step occurs contemporaneously with said first step.

8. The method of claim 6, wherein the first step is completed prior to beginning the second step.

* * * * *